(12) United States Patent
Huang

(10) Patent No.: US 8,109,322 B2
(45) Date of Patent: Feb. 7, 2012

(54) HEAT PLATE TYPE COOLER MODULE

(76) Inventor: Tsung-Hsien Huang, I-Lan Hsien (TW)

( * ) Notice: Subject to any disclaimer, the term of this patent is extended or adjusted under 35 U.S.C. 154(b) by 890 days.

(21) Appl. No.: 12/134,190

(22) Filed: Jun. 6, 2008

(65) Prior Publication Data

US 2009/0266518 A1  Oct. 29, 2009

(30) Foreign Application Priority Data

Apr. 29, 2008  (TW) ................ 97115667 A

(51) Int. Cl.
*F28F 7/00* (2006.01)
(52) U.S. Cl. .................................................... 165/80.3
(58) Field of Classification Search ............. 165/80.3, 165/104.33, 104.14
See application file for complete search history.

(56) References Cited

U.S. PATENT DOCUMENTS

| | | | | |
|---|---|---|---|---|
| 4,345,642 A * | 8/1982 | Ernst et al. | ...................... | 165/86 |
| 6,082,443 A * | 7/2000 | Yamamoto et al. | ...... | 165/104.26 |
| 7,165,603 B2 * | 1/2007 | Mochizuki et al. | ...... | 165/104.21 |
| 2006/0164808 A1 * | 7/2006 | Stefanoski | .................... | 361/700 |
| 2006/0227506 A1 * | 10/2006 | Lee et al. | ...................... | 361/697 |
| 2006/0284914 A1 * | 12/2006 | Murakami et al. | .............. | 347/17 |

* cited by examiner

*Primary Examiner* — Judy Swann
*Assistant Examiner* — Ignacio E Landeros
(74) *Attorney, Agent, or Firm* — Pai Patent & Trademark Law Firm; Chao-Chang David Pai

(57) ABSTRACT

A heat plate type cooler module includes a heat plate, which is formed of a bottom cover plate and a top cover plate and having a working fluid filled in a vacuum chamber between the top cover plate and the bottom cover plate; heat pipes each having a cold end and a top end; a locating plate covered on the heat plate to hold the hot end of each heat pipe in contact with the heat plate; and radiation fins fastened to the cold ends of the heat pipe by press-fitting.

11 Claims, 9 Drawing Sheets

HEAT PLATE TYPE COOLER MODULE

BACKGROUND OF THE INVENTION (a) Field of the Invention

The present invention relates to cooler modules and more particularly to a heat plate type cooler module, which comprises a hollow heat plate having filled therein a working fluid, a plurality of heat pipes for transferring heat from the heat plate to a plurality of radiation fins press-fitted onto the cold ends of the heat pipes, and a locating plate affixed to the heat plate to hold the hot ends of the heat pipes in close contact with the heat plate.

(b) Description of the Prior Art

A conventional cooler module comprises a metal base plate, at least one heat pipe, and a radiation fin module formed of a plurality of radiation fins. Each heat pipe has one end inserted through the radiation fins, and the other end bonded to the metal base plate. The metal base plate may be extruded from copper or aluminum. The heat pipe is bonded to the metal base plate by welding with a solder paste. If the heat pipe and the base plate are made of different metal materials, an extra electroplating procedure is necessary. This electroplating procedure is complicated, thus increasing the installation cost and defect rate and lowering the heat transfer efficiency between the metal base plate and the heat pipe.

Therefore, it is desirable to provide a cooler module that eliminates the aforesaid drawbacks.

SUMMARY OF THE INVENTION

The present invention has been accomplished under the circumstances in view. According to one aspect of the present invention, the heat plate type cooler module comprises a heat plate, a locating plate, and at least one heat pipe. The heat plate has a vacuum chamber filled with a working fluid. Each heat pipe has a hot end kept in contact with the heat plate for rapidly transferring heat from the heat pipe to the radiation fins. The locating plate is affixed to the heat plate to hold the hot end of each heat pipe in place.

According to another aspect of the present invention, the cooler module further comprises a plurality of radiation fins fastened to the cold end of each heat pipe. The cold ends of the heat pipes can be tightly inserted through the radiation fins. The radiation fins are arranged into a radiation fin module. During application, heat energy is transferred from the heat source, for example, an IC chip, by the heat plate through the heat pipes to the radiation fins for quick dissipation into the open air. Further, an electric fan may be installed on or near the radiation fins to enhance heat dissipation performance.

According to still another aspect of the present invention, the hot end of each heat pipe is a flat end for close contact with the surface of the heat plate.

According to still another aspect of the present invention, each of the heat pipes has one end bent into a horizontal section terminating in a hot end for close contact with the heat plate. Further, such heat pipes can be arranged in two sets and bonded to the heat plate, and mounted with an electric fan to enhance heat dissipation performance.

According to still another aspect of the present invention, the heat pipes can be U-shaped pipes, each having one middle part, i.e., the hot interface kept in close contact with the heat plate, and two opposite cold ends fastened to the radiation fins by means of press-fitting. Further, an electric fan may be mounted on the radiation fins to enhance heat dissipation performance.

DETAILED DESCRIPTION OF THE PREFERRED EMBODIMENTS

Figure 1:
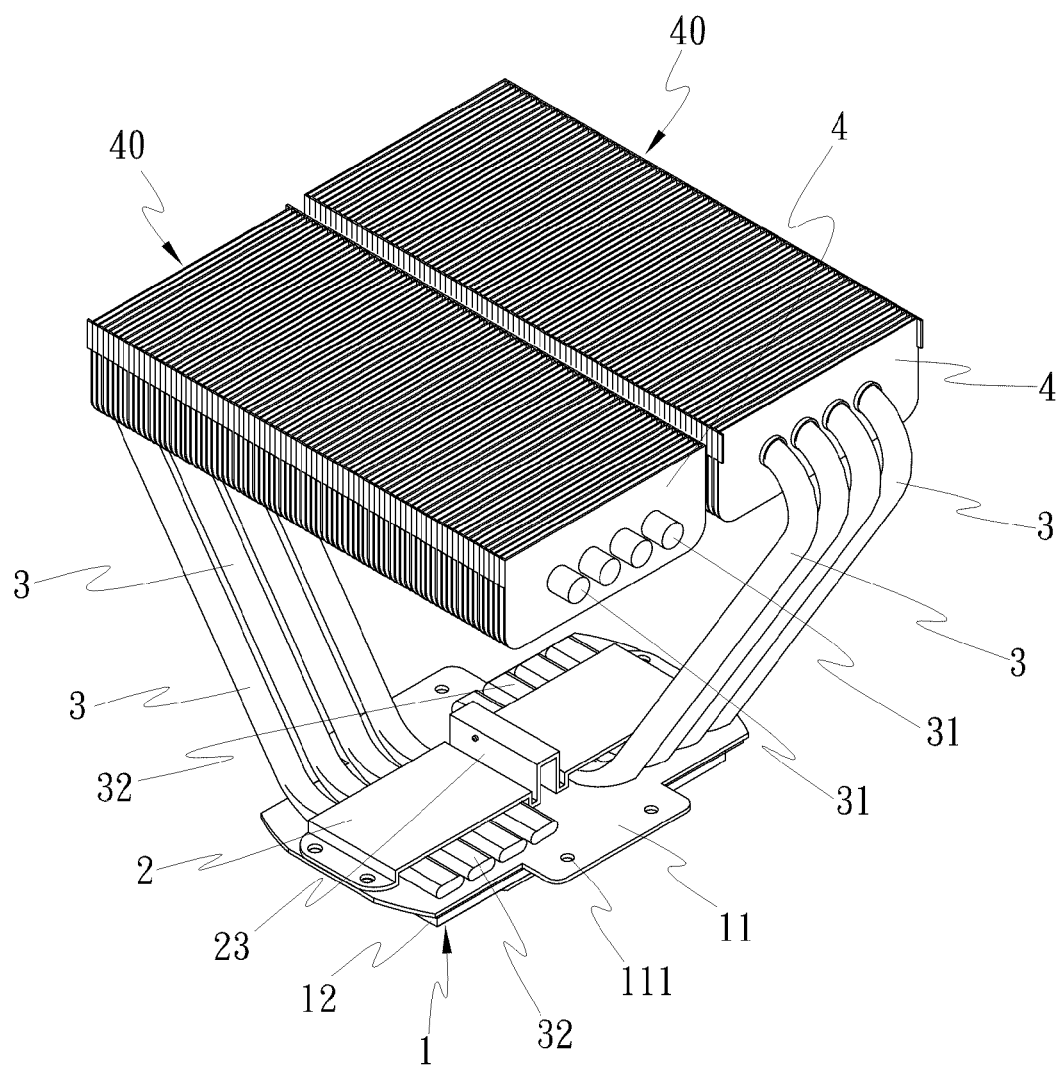
FIG. 1 is an elevational view of a heat plate type cooler module in accordance with a first embodiment of the present invention.
Figure 2:
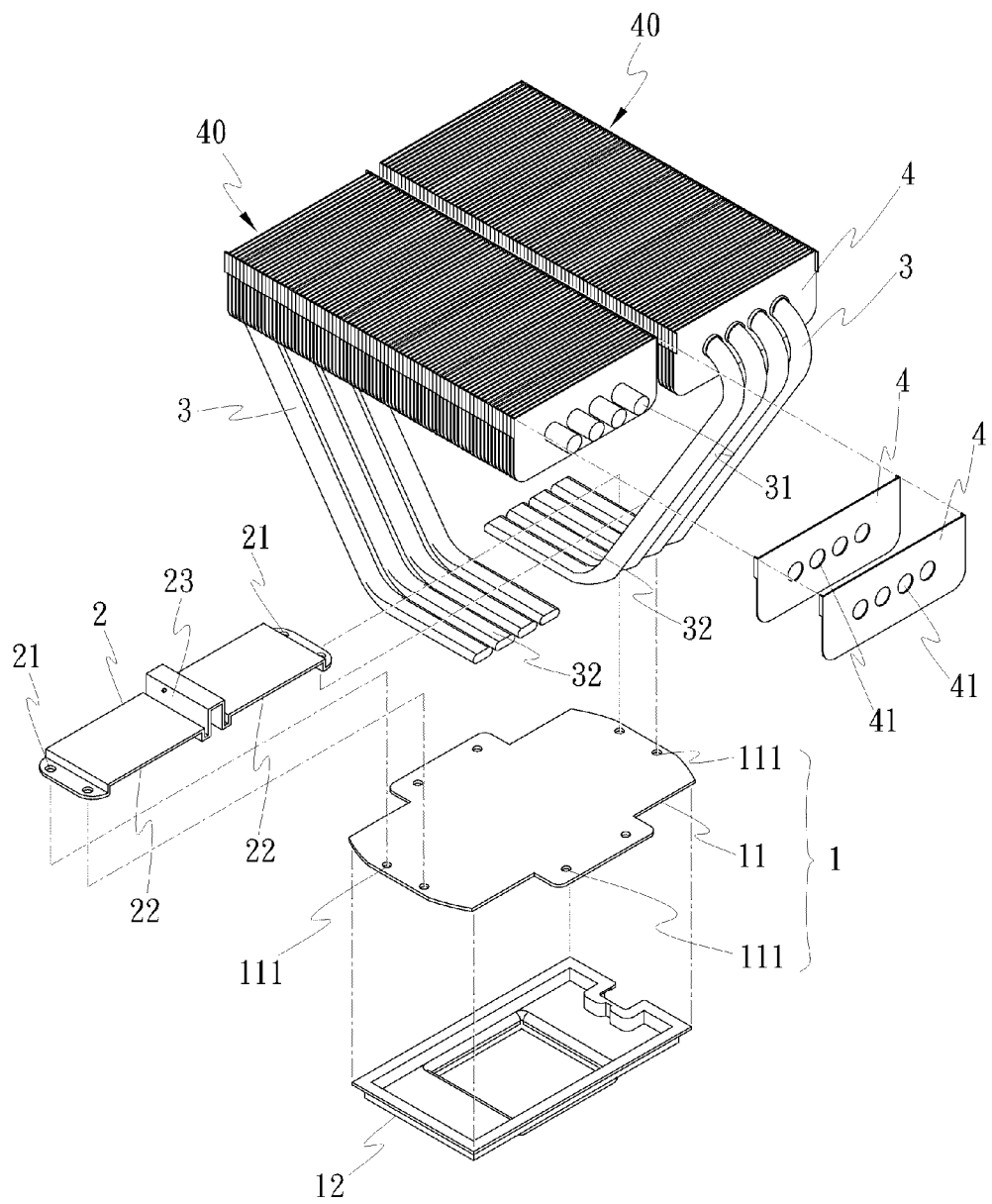
FIG. 2 is an exploded view of the heat plate type cooler module in accordance with the first embodiment of the present invention.
Figure 3:
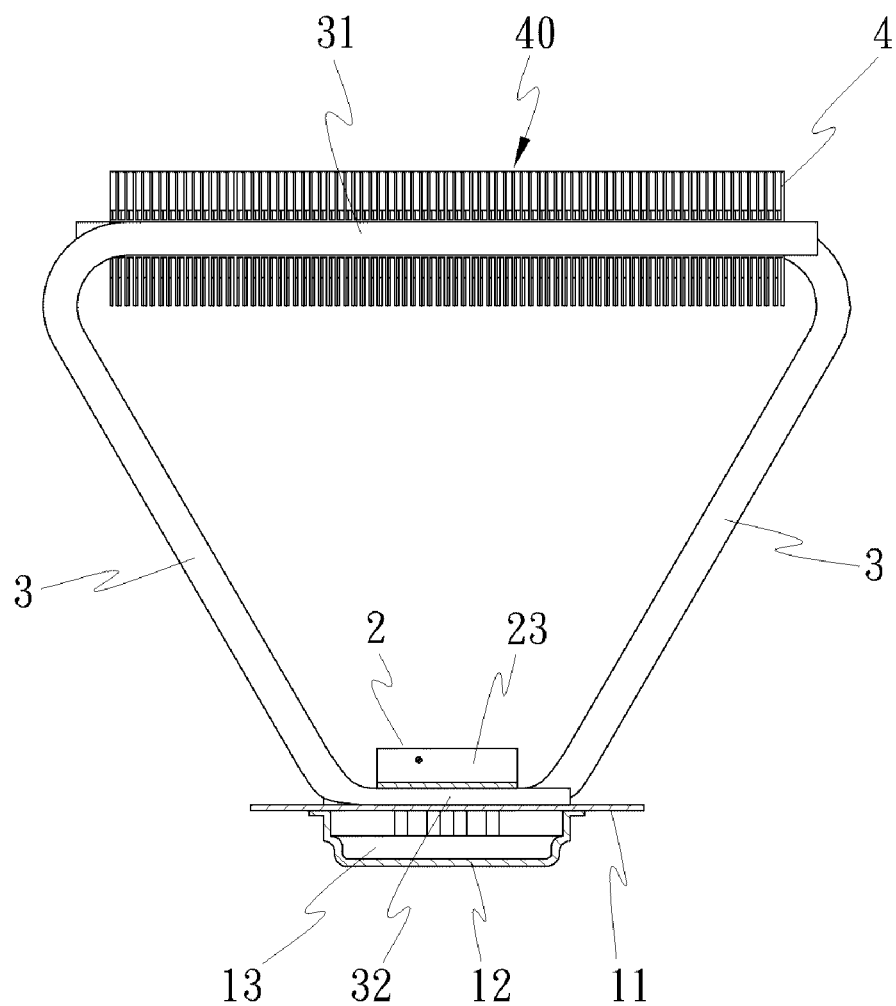
FIG. 3 is a sectional assembly view of the heat plate type cooler module in accordance with the first embodiment of the present invention.

Referring to FIGS. 1 and 2, a heat plate type cooler module in accordance with a first embodiment of the present invention comprises a heat plate 1, a locating plate 2, and at least one heat pipe 3. Each heat pipe 3 has a cold end 31 tightly inserted through multiple radiation fins 4 (see FIG. 3).

The heat plate 1, as shown in FIG. 2, comprises a top cover plate 11 and a recessed bottom cover plate 12. The top cover plate 11 and the recessed bottom cover plate 12 are fixedly fastened together, defining a watertight vacuum chamber 13 that is filled with a liquid heat transfer medium (see FIG. 3). The top cover plate 11 has a dimension greater than the recessed bottom cover plate 12. Further, the top cover plate 11 has a plurality of mounting through holes 111 cut through the top and bottom sides around the border area and outside the recessed bottom cover plate 12.

The locating plate 2 is a metal plate fitting over and bonded to the hot ends 32 of the heat pipes 3 and fixedly fastened to the heat plate 1 to hold down the hot ends 32 of the heat pipes 3 in close contact with the heat plate 1, having a plurality of mounting through holes 21 respectively fastened to respective mounting through holes 111 of the top cover plate 11, a plurality of transversely extending bottom locating grooves 22 that accommodate the hot ends 32 of the heat pipes 3, and a springy middle protruding portion 23. According to this embodiment, the bottom locating grooves 22 of the locating plate 2 fit the hot ends 32 of two sets of heat pipes 3 that extend in opposite directions.

The heat pipes 3 are sealed pipes or tubes made of material with high thermal conductivity that can transport large quantities of heat between the respective hot ends 32 and respective cold ends 31. The hot ends 32 of the heat pipes 3 are closely attached to the top surface of the top cover plate 11 of the heat plate 1, and then the locating plate 2 is covered on the hot ends 32 of the heat pipes 3 and affixed to the top cover plate 11 of the heat plate 1 so that the locating plate 2, the hot ends 32 of the heat pipes 3 and the heat plate 1 are bonded together.

As stated above, the cold ends 31 of the heat pipes 3 are tightly inserted through the radiation fins 4. Each radiation fin 4 has insertion holes 41 slightly smaller than the diameter of the cold ends 31 of the heat pipes 3. The cold ends 31 of the heat pipes 3 are respectively press-fitted into the insertion holes 41 of the radiation fins 4 (see FIG. 3). A welding technique may be employed to affix the cold ends 31 of the heat pipes 3 to the radiation fins 4. According to this embodiment, the radiation fins 4 are stacked into two radiation fin modules 40. When in use, heat is transferred from the heat source, for example, a semiconductor chip, through the heat plate 1 and the heat pipes 3 to the radiation fins 4 for quick dissipation into the open air.

The hot end 32 of each heat pipe 3 is a flat end for close contact with the top surface of the top cover plate 11. Further, an electric fan may be mounted on the radiation fin modules 40 to enhance heat dissipation efficiency.

Figure 4:
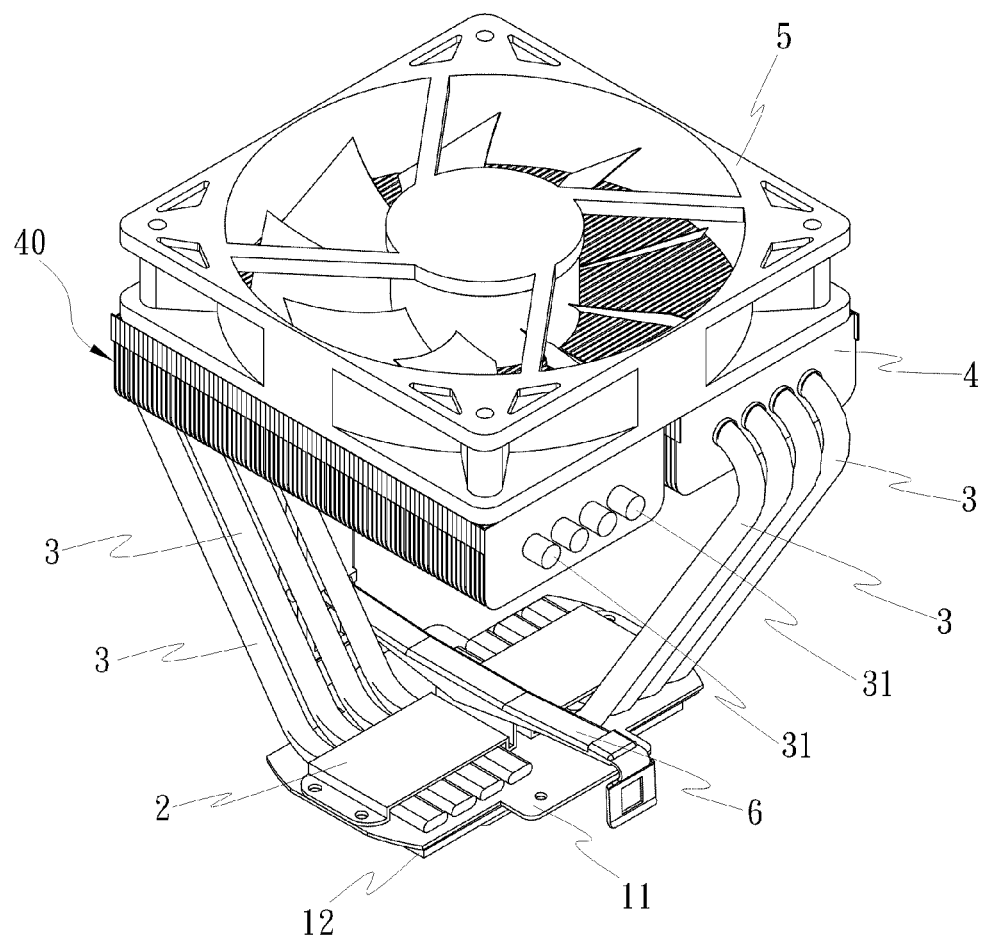
FIG. 4 shows the first embodiment of the present invention with a fan mounted on the top of the heat plate type cooler module.

According to the present first embodiment, the heat pipes 3 each have two horizontal end sections pointing in a substantially same direction. Namely, the two ends of each heat pipe 3 are bent into horizontal sections, forming the respectively cold end 31, which is press fitted into the radiation fins 4 (a bonding technique may be employed to affix the cold ends 31 of the heat pipes 3 to the radiation fins 4), and the respective hot end 32, which is bonded to the heat plate 1 (see FIG. 3). Further, an electric fan 5 is mounted on the two radiation fin modules 40 at the top side (see FIG. 4).

The springy middle protruding portion 23 of the locating plate 2 is to match with a fastener 6 that fastens the heat plate type cooler module to, for example, a chip socket, keeping the heat plate 1 in close contact with the chip in the chip socket. The fastener 6 is not limited to the configuration shown in the drawing.

Figure 5:
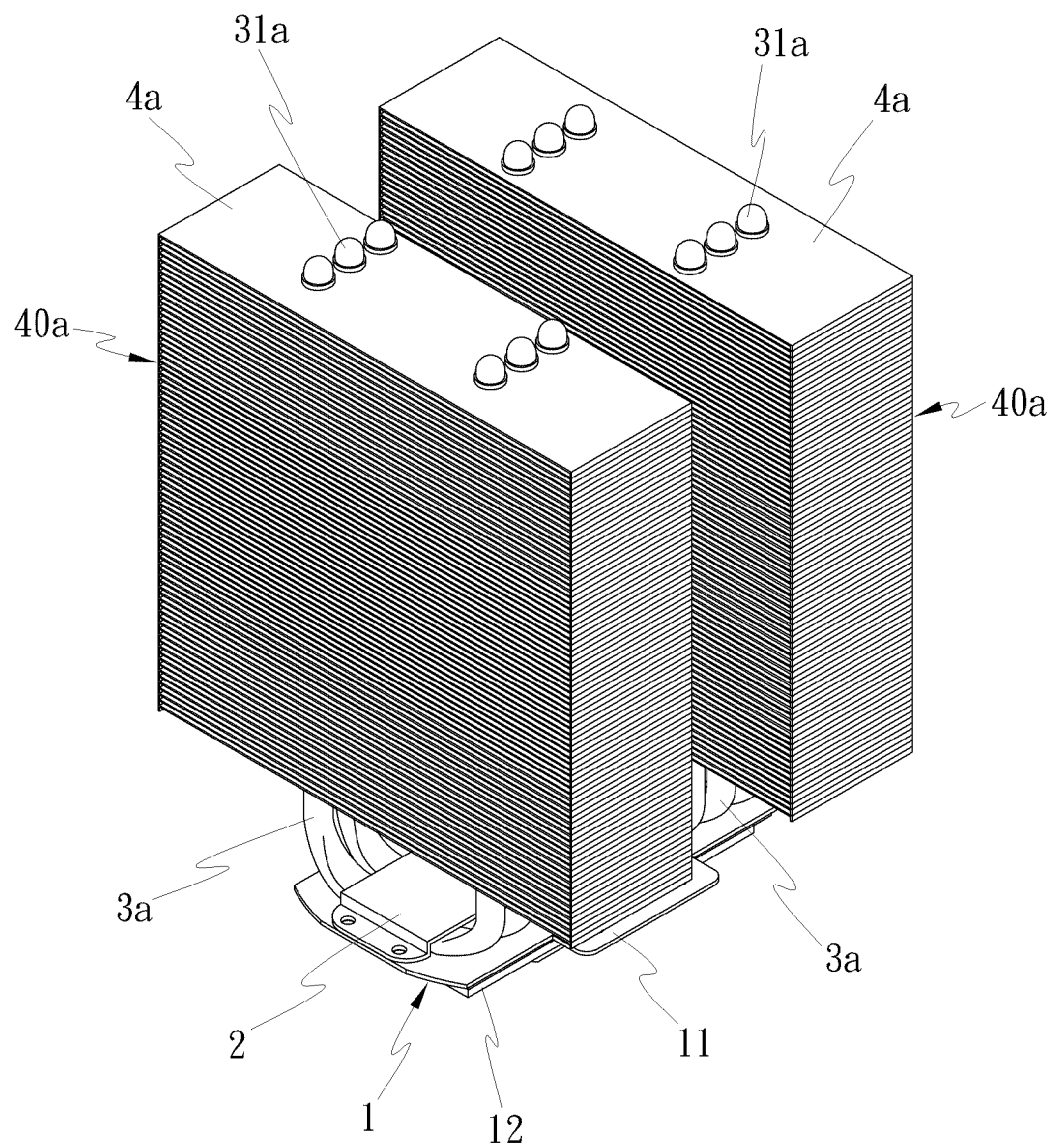
FIG. 5 is an elevational view of a heat plate type cooler module in accordance with a second embodiment of the present invention.
Figure 6:
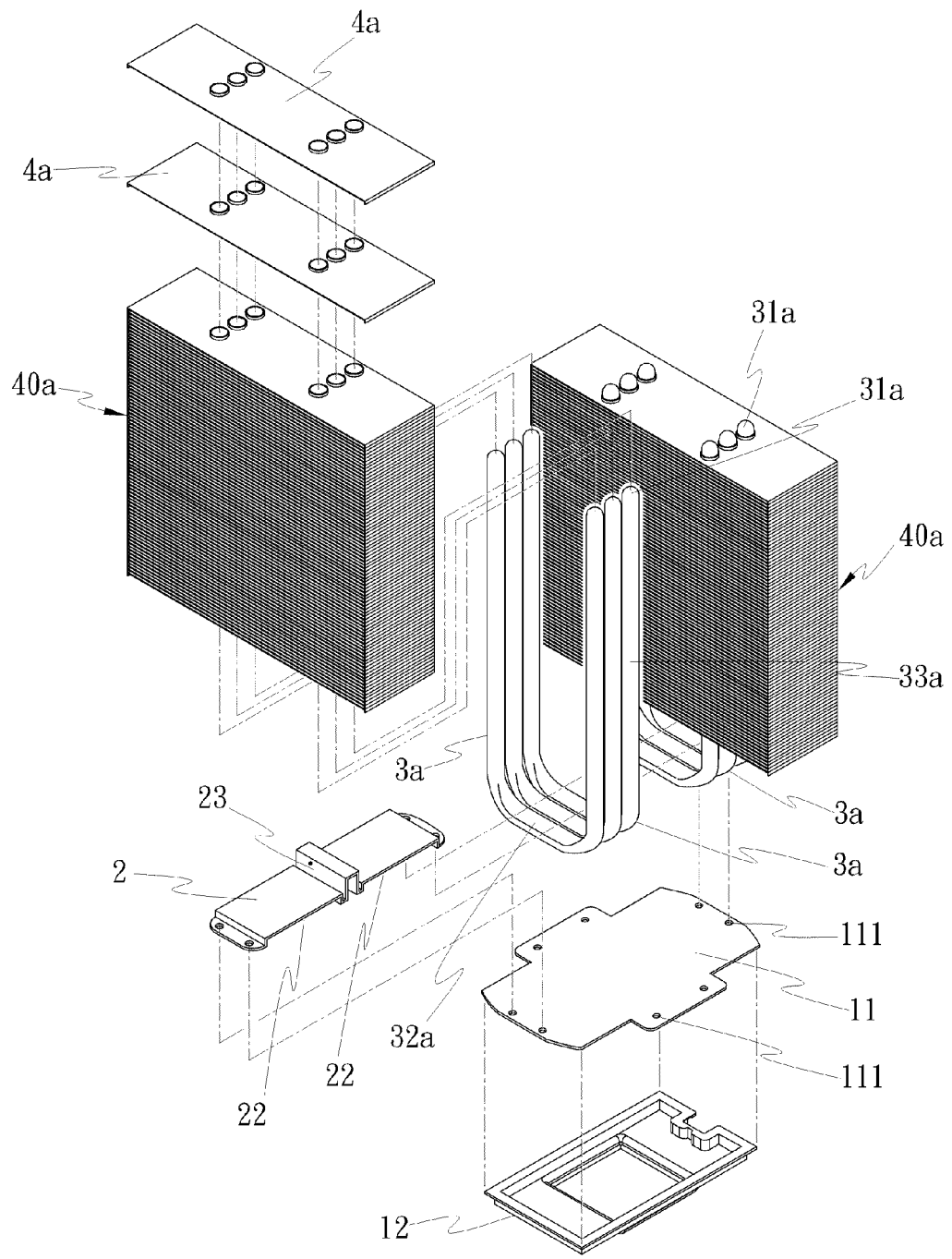
FIG. 6 is an exploded view of the heat plate type cooler module in accordance with the second embodiment of the present invention.
Figure 7:
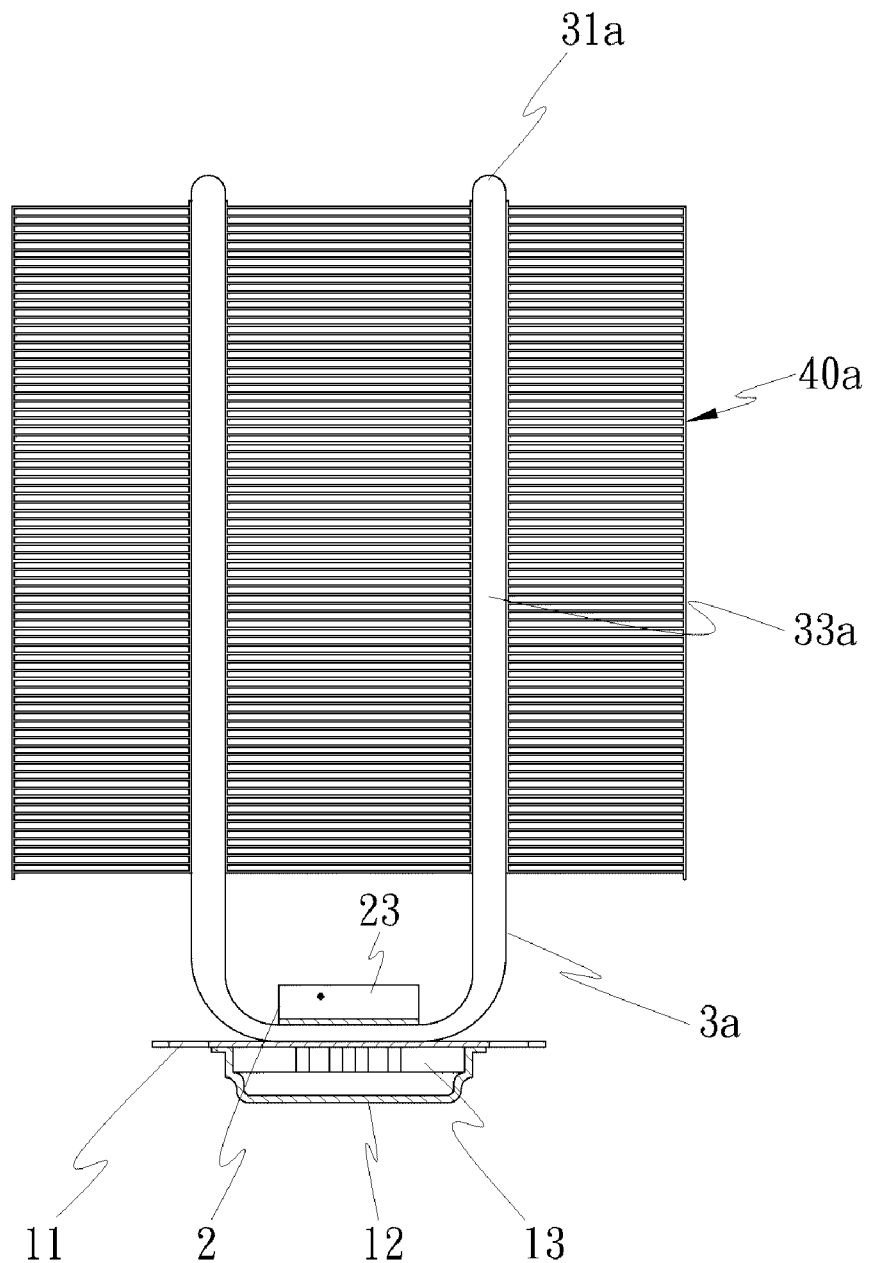
FIG. 7 is a sectional assembly view of the heat plate type cooler module in accordance with the second embodiment of the present invention.
Figure 8:
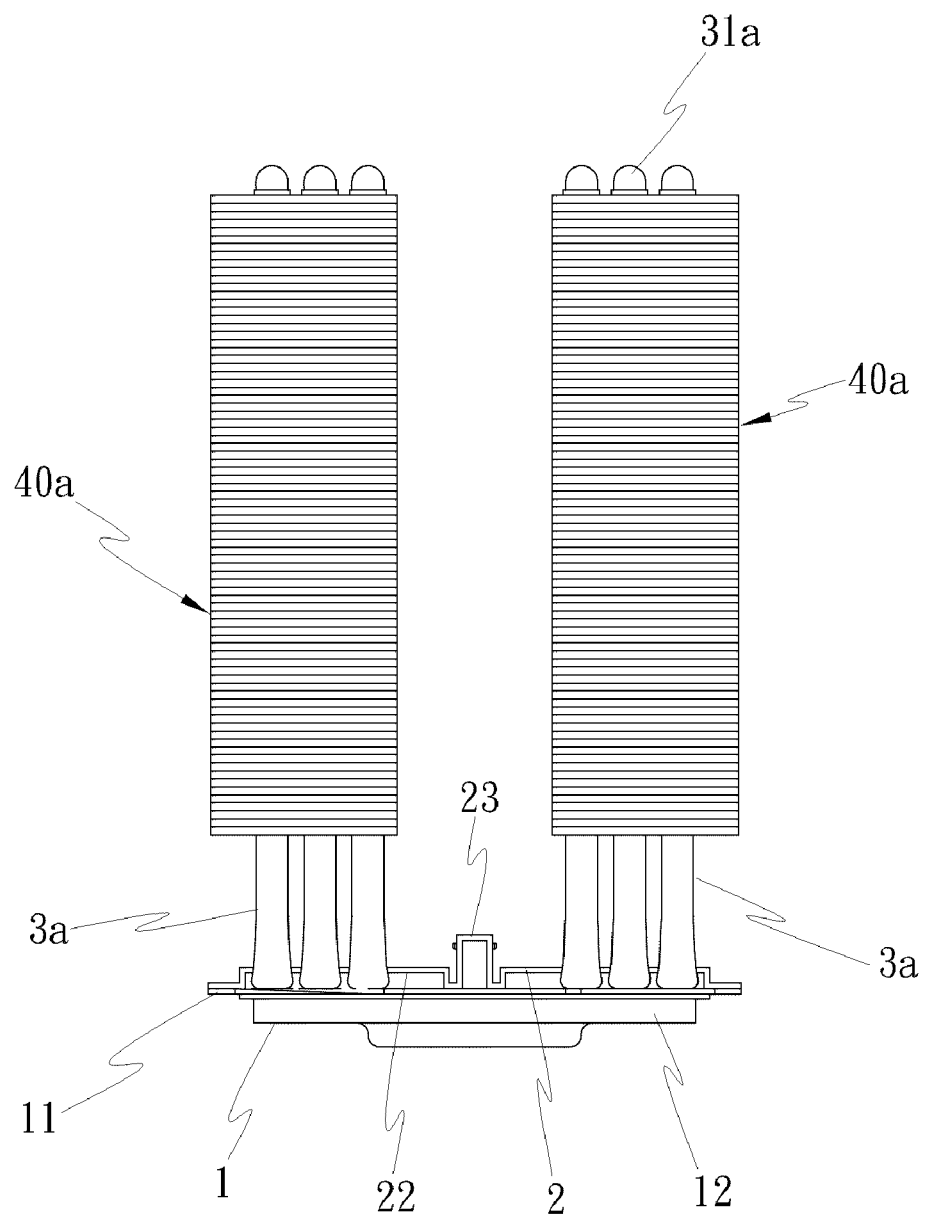
FIG. 8 is another sectional assembly view of the heat plate type cooler module in accordance with the second embodiment of the present invention when viewed from another side.
Figure 9:
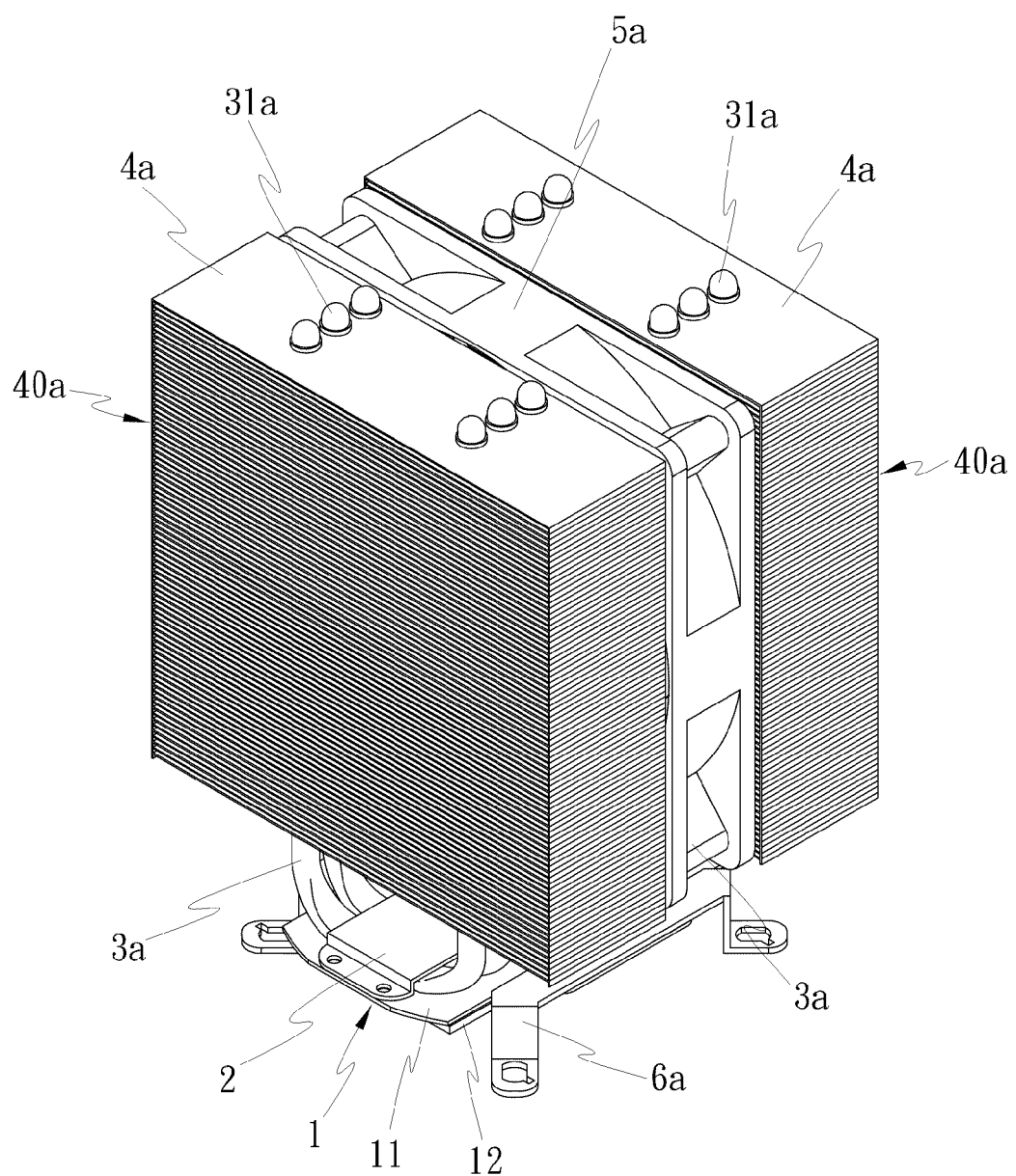
FIG. 9 shows the second embodiment of the present invention with a fan mounted on the top of the heat plate type cooler module.

FIGS. 5~7 show a heat plate type cooler module in accordance with a second embodiment of the present invention. According to this second embodiment, the heat plate type cooler module comprises a heat plate 1, a locating plate 2, and at least one heat pipe 3a. Each heat pipe 3a has two cold interfaces 31a tightly inserted through (or bonded to) multiple radiation fins 4a. According to this embodiment, the heat pipes 3a are U-pipes, each having a middle part, i.e., the hot interface 32a for direct contact with the heat plate 1 and two arms, i.e., the cold interfaces 33a respectively tightly inserted through (or bonded to) the radiation fins 4a. According to this embodiment, the radiation fins 4a are stacked into two radiation fin modules 40a (see FIGS. 7 and 8). Further, an electric fan 5a may be mounted between the two radiation fin modules 40a to enhance heat dissipation performance.

As stated above, the heat pipes 3 or 3a can be tightly inserted through the radiation fins 4 or 4a or directly bonded to the radiation fins 4 or 4a. Further, the number and shape of the radiation fins 4 or 4a are not limited to the aforesaid two embodiments. It is the most economic way to fasten the cold ends 31 or cold interfaces 31a to the radiation fins 4 or 4a by means of a press-fitting mounting technique.

Although particular embodiments of the invention have been described in detail for purposes of illustration, various modifications and enhancements may be made without departing from the spirit and scope of the invention.

What is claimed is:

1. A cooler module comprising a heat plate, at least one heat pipe, and a locating plate fastened to said heat plate to affix said at least one heat pipe to said heat plate, wherein:

said heat plate comprises a bottom cover plate, a top cover plate sealed to said bottom cover plate, a vacuum chamber defined between said bottom cover plate and said top cover plate, and a working fluid filled in said vacuum chamber; and said locating plate is covered on said heat plate and comprises at least two transversely extending bottom locating grooves and a springy middle protruding portion separating the transversely extending bottom locating grooves into two groups, wherein each of the transversely extending bottom locating grooves accommodates a subset of said at least one heat pipe to hold one hot interface of each said heat pipe in contact with said heat plate, and a fastener attached to the springy middle protruding portion of the locating plate for fastening the heat plate to a heat source.

2. The cooler module as claimed in claim 1, wherein said at least one heat pipe is mounted with a plurality of radiation fins, each said heat pipe having at least one cold interface respectively press-fitted into said radiation fins.

3. The cooler module as claimed in claim 1, wherein said top cover plate of said heat plate has a dimension greater than said bottom cover plate of said heat plate, and said top cover plate has a plurality of mounting through holes cut through top and bottom sides thereof outside said bottom cover plate.

4. The cooler module as claimed in claim 1, wherein said locating plate has a plurality of mounting through holes respectively fastened to respective mounting through holes of said top cover plate.

5. The cooler module as claimed in claim 1, wherein the hot interface of each said heat pipe has a flat configuration.

6. The cooler module as claimed in claim 1, wherein each said heat pipe has two horizontal end sections pointing in a substantially same direction, one of which terminating in the respective hot interface.

7. The cooler module as claimed in claim 6, wherein said at least one heat pipe includes a plurality of heat pipes arranged in two sets and bonded to said heat plate.

8. The cooler module as claimed in claim 2, wherein said radiation fins are arranged into a radiation fin module and mounted with an electric fan.

9. The cooler module as claimed in claim 1, wherein said at least one heat pipe includes a plurality of U-shaped heat pipes, each having two opposite ends respectively terminating in a respective cold interface.

10. The cooler module as claimed in claim 9, wherein the cold interfaces of said U-shaped heat pipes are mounted with a radiation fin module formed of a plurality of radiation fins, the cold interfaces of said U-shaped heat pipes being tightly inserted through said radiation fins.

11. The cooler module as claimed in claim 1, wherein each transversely extending bottom locating groove accommodates at least two of the heat pipes.

* * * * *